(12) United States Patent
Kim et al.

(10) Patent No.: US 10,490,680 B2
(45) Date of Patent: Nov. 26, 2019

(54) METHOD FOR MANUFACTURING LIGHT ABSORPTION LAYER

(71) Applicant: SK INNOVATION CO., LTD., Seoul (KR)

(72) Inventors: Jin Hyock Kim, Daejeon (KR); Hye Ri Kim, Daejeon (KR); Sung Jae An, Daejeon (KR); Jin Woong Kim, Daejeon (KR)

(73) Assignee: SK Innovation Co., Ltd., Seoul (KR)

( * ) Notice: Subject to any disclaimer, the term of this patent is extended or adjusted under 35 U.S.C. 154(b) by 329 days.

(21) Appl. No.: 14/773,066

(22) PCT Filed: May 7, 2014

(86) PCT No.: PCT/KR2014/004023
§ 371 (c)(1),
(2) Date: Sep. 4, 2015

(87) PCT Pub. No.: WO2014/182049
PCT Pub. Date: Nov. 13, 2014

(65) Prior Publication Data
US 2016/0064582 A1    Mar. 3, 2016

(30) Foreign Application Priority Data
May 10, 2013 (KR) .................. 10-2013-0052800

(51) Int. Cl.
*H01L 31/18* (2006.01)
*H01L 31/032* (2006.01)
*H01L 31/0749* (2012.01)

(52) U.S. Cl.
CPC ...... *H01L 31/0322* (2013.01); *H01L 31/0749* (2013.01); *H01L 31/18* (2013.01); *Y02E 10/541* (2013.01); *Y02P 70/521* (2015.11)

(58) Field of Classification Search
CPC .................................................. H01L 31/0322
See application file for complete search history.

(56) References Cited

U.S. PATENT DOCUMENTS 4,335,266 A * 6/1982 Mickelsen .......... H01L 31/0322
                                                              136/260
6,323,417 B1    11/2001 Gillespie et al.
(Continued)

FOREIGN PATENT DOCUMENTS

KR         101181252         9/2012

OTHER PUBLICATIONS

Zhu, et al., Solar Energy Materials and Solar Cells, 2013, vol. 113, pp. 140-143.*
(Continued)

*Primary Examiner* — Sadie White
(74) *Attorney, Agent, or Firm* — IP & T Group LLP

(57) ABSTRACT

Provided is a method of fabricating a CIGS absorption layer which, may have improved material utilization and productivity and have excellent thin film uniformity even in a large area by depositing and heat treating a precursor having a multilayer structure by a sputtering method using a compound, target of $In_xGa_ySez$(IGS) and $Cu_xSe_y$ (CS).

8 Claims, 5 Drawing Sheets

(56) References Cited

U.S. PATENT DOCUMENTS

| | | |
|---|---|---|
| 2002/0106873 A1 | 8/2002 | Beck et al. |
| 2009/0199895 A1* | 8/2009 | Basol .................. H01L 31/0322 |
| | | 136/252 |
| 2011/0011460 A1* | 1/2011 | Munteanu ........... C23C 14/0057 |
| | | 136/264 |
| 2011/0083743 A1 | 4/2011 | Yamamoto |
| 2011/0168258 A1* | 7/2011 | Palm ................... H01L 31/0322 |
| | | 136/258 |
| 2011/0174363 A1* | 7/2011 | Munteanu ......... H01L 21/02425 |
| | | 136/255 |

OTHER PUBLICATIONS

Jung, et al., Current Applied Physics, 2010, vol. 10, pp. 990-996.*
Komaki, H., et al., Fabrication of integrated CIGS modules using the in-line three-stage process, Photovoltaic Specialists Conference, PVSC 2008. 33rd IEEE, May 11-16, 2008, pp. 1-4.
Hibberd, C. J., et al., Structural properties of Cu(In,Ga)Se-2 thin films prepared from chemically processed precursor layers, Thin Solid Films, 2009, pp. 2235-2239, vol. 517.
Office Action issued by the State Intellectual Property Office dated Nov. 7, 2016.

* cited by examiner

METHOD FOR MANUFACTURING LIGHT ABSORPTION LAYER

This application is a national stage application of PCT/KR2014/004023 filed on May 7, 2014, which claims priority of Korean patent application number 10-2013-0052800 filed on May 10, 2013. The disclosure of each of the foregoing applications is incorporated herein by reference in its entirety.

TECHNICAL FIELD

The present invention relates to a method of fabricating a light absorption layer of a solar cell.

BACKGROUND ART

A solar ceil which is eco-friendly alternative energy is an apparatus which uses electrons and holes generated by absorbed photons to convert light energy into electric energy. In detail, the solar cell has a p-n junction structure in which a positive (p) type semiconductor is functioned to a negative (N) type semiconductor and thus when receiving sunlight, the solar cell generates holes and electrons within the semiconductors due to energy of the incident sunlight and generates a potential as the holes (+) move to the p type semiconductor and the electrons (−) move to the n type semiconductor by an electric field generated at the p-n junction, such that the solar cell produces power.

The solar cell may be classified into a substrate type solar cell and a thin film type solar cell. The substrate type solar cell uses a semiconductor material such as silicon as a substrate and mainly uses a bulk type crystalline silicon substrate. The solar cell may have high efficiency and stability, but may be expensive, may be difficult to make a thickness of an absorption layer thin, and may perform an intermittent process. Meanwhile, the thin film solar cell is fabricated of amorphous silicon, thin film polycrystalline silicon, copper indium gallium diselenide (CIGS), cadmium telluride compound (CdTe), organic materials, and the like and therefore may make the thickness of the absorption layer thin and may use glass, metal, or plastic as a substrate and therefore may be continuously mass-produced to be economical.

The thin film solar cell is configured of a substrate, a lower electrode which is formed on the substrate, an absorption layer which absorbs light to generate electricity, a window layer through which light passes, and a superstrate for protecting the lower layers. In this case, the absorption layer uses a p-type semiconductor and the window layer uses an n-type semiconductor to have a p-n diode structure.

As a material forming the light absorption layer, the thin film type solar cell uses CuInSe2 which is a base, and may use CuGaSe2 using gallium (Ga) instead of indium (In) or a quaternary material of CU(In, Ga)Se2 simultaneously using indium (In) and gallium (Ga). Further, the thin film type solar cell may use CuInS2, Cu(In, Ga)S2, or the like in which selenium (Se) is substituted into sulfur (S) and a rive component-based material of Cu(In, Ga) (Se, S)2 simultaneously using selenium (Se) and sulfur (S).

A band gap is controlled by adding other elements to CuInSe2, thereby increasing light-electricity conversion efficiency. In this case, when the thin film type solar ceil has the same composition in a thickness direction of the absorption layer, a the thin film type solar ceil has a predetermined band gap, but forms grading in the thickness direction of the thin film due to the added element and thus makes carrier collection easy due to the formed electric field, thereby increasing the light-electricity conversion efficiency. In particular, as compared with a single grading method which constantly increases the band gap in the thickness direction, a double grading method which controls the band gap in a V-letter type may more increase efficiency by 2 to 3%, such that the implementation of the double grading method is essential to a high-efficiency solar cell.

In the thin film type solar cell, the light absorption layer is fabricated by using co-evaporating metal elements or binary compounds as a main material or co-sputtering an alloy of Cu, In, and Ga, depositing these elements on the substrate, and then selenizing these elements. In this case, a method of fabricating an absorption layer using the co-evaporating grows the (In, Ga) Se layer into a crystal at a temperature of about 350° C. and increases the temperature of 350° C. to a high temperature of 550 to 600° C. and then deposits a second CuSe layer. The CIGS is simultaneously formed by reaction between the previously deposited IGS layer and a newly deposited CS layer. When the CS reacts with the IGS, a reaction rate of Cu—In is more rapid than that of Cu—Ga and therefore Ga has a higher concentration (grading) toward a lower electrode layer and when the first IGS is entirely converted into the GIGS, a third IGS layer is deposited. The Cu concentration is in a Cu rich GIGS state higher than stoichiometric CIGS immediately before the third IGS layer is deposited, and the IGS layer is converted into Cu deficient GIGS while being additionally deposited. Further, similar to the first layer, when the third layer is deposited, Cu is diffused to the third IGS layer which is being deposited, in which Ga has a higher concentration toward a buffer layer and a window layer which are to be deposited later and thus the double grading method may be implemented. However, as the double grading uses a high temperature of about 550 to 600° C., large-area uniformity may not be secured due to deflection, and the like in the case of using general soda-lime glass and therefore it is difficult to implement a large area and material utilization is low and therefore production cost may be increased.

Meanwhile, in the case of using a sputtering method as a method of depositing a light absorption layer, after Cu—Ga and In are sputtered, a process of performing selenization or sulfuration on the sputtered Cu—Ga and In is used, but forms a void within, the absorption layer at the time of selenization, and the like, such that it is difficult to fabricate a solar cell having high efficiency and reliability.

DISCLOSURE

Technical Problem

An object of the present invention is to provide a method of fabricating a light absorption layer of a solar cell which may suppress a formation of a void, and secure reliability while having excellent thin film uniformity even at the time of a large area process, and have excellent productivity at low cost, by forming the light absorption layer by a sputtering method at low temperature using a compound target.

Technical Solution

In one general aspect,
a method of fabricating a solar cell includes: forming a lower electrode layer on a substrate;
forming a first precursor layer on the lower electrode layer by performing sputtering using a target consisting of a compound of IIIb group elements and Se;

forming a second precursor layer on the first precursor layer by performing the sputtering using a target consisting of a compound, of Ib group elements and Se;

forming a third precursor layer on the second precursor layer by performing the sputtering using the target consisting of a compound of IIIb group elements and Se;

forming the light absorption layer toy forming the third precursor layer and then performing a Se atmosphere heat treatment process;

forming a buffer layer on the light absorption layer; and forming an upper electrode layer on the buffer layer.

The forming of the first precursor layer, the forming of the second precursor layer, and the forming of the third precursor layer may be performed within a temperature range between 20° C. and 500° C.

The forming of the first precursor layer, the forming of the second precursor layer, and the forming of the third precursor layer may be performed within the same temperature range or different temperature ranges.

At the time of forming each of the precursor layers within different temperature ranges, after the first precursor, when the second precursor layer is deposited at lower temperature, a natural cooling method may be used by radiation under vacuum atmosphere to lower temperature and after the second precursor layer, when the third precursor layer is deposited at higher temperature, a rapid heat treatment method may be used or an isothermal oven, may be used. In this case, a heating rate may be controlled to a range between 1° C./S and 10° C./s.

The method may further include: after the performing of the Se atmosphere heat treatment process, performing heat treatment using H2S.

The first precursor layer may have a Ga/(Ga+In) composition ratio of 0.2 to 0.6.

The first precursor layer may be a single layer or a plurality of layers of two layers or more and have a reduced gallium (Ga) content toward a thickness direction of the second precursor layer.

The third precursor layer may have a Ga/(Ga+In) composition ratio of 0.2 to 0.6.

The third precursor layer may be a single layer or a plurality of layers of two layers or more and have an increased gallium (Ga) content toward a thickness direction of the buffer layer.

A ratio of the gallium (Ga) content of the first precursor layer to the gallium (Ga) content of the third precursor layer may be 1:1 to 3:1.

A ratio of a thickness of the first precursor layer to a thickness of the third precursor layer may be 1:1 to 5:1.

In another general aspect, a solar cell is fabricated by the method of fabricating a solar cell.

Advantageous Effects

According to the method of fabricating a solar cell in accordance with the exemplary embodiments of the present invention, the compound target is sputtered at low temperature, thereby increasing the material utilization and saving the production cost to be economical.

Further, according to the exemplary embodiments of the present invention, the generation of the void may be suppressed within the light absorption layer and at the time of the large area process, the reliability may be secured while showing the excellent thin film uniformity.

Further, according to the exemplary embodiments of the present invention, unlike the physical vapor deposition (PVD) method such as the vacuum co-evaporation, as the substrate surface to be deposited is not limited as being disposed at the upper and lower portions but the deposition disposition direction such as depositing the glass substrate vertically or approximately vertically is free, the equipment for preventing the problem such as the substrate deflection which may be caused at the large area process may be easily designed, thereby maximizing the productivity due to the large area.

BEST MODE

Figure 1:
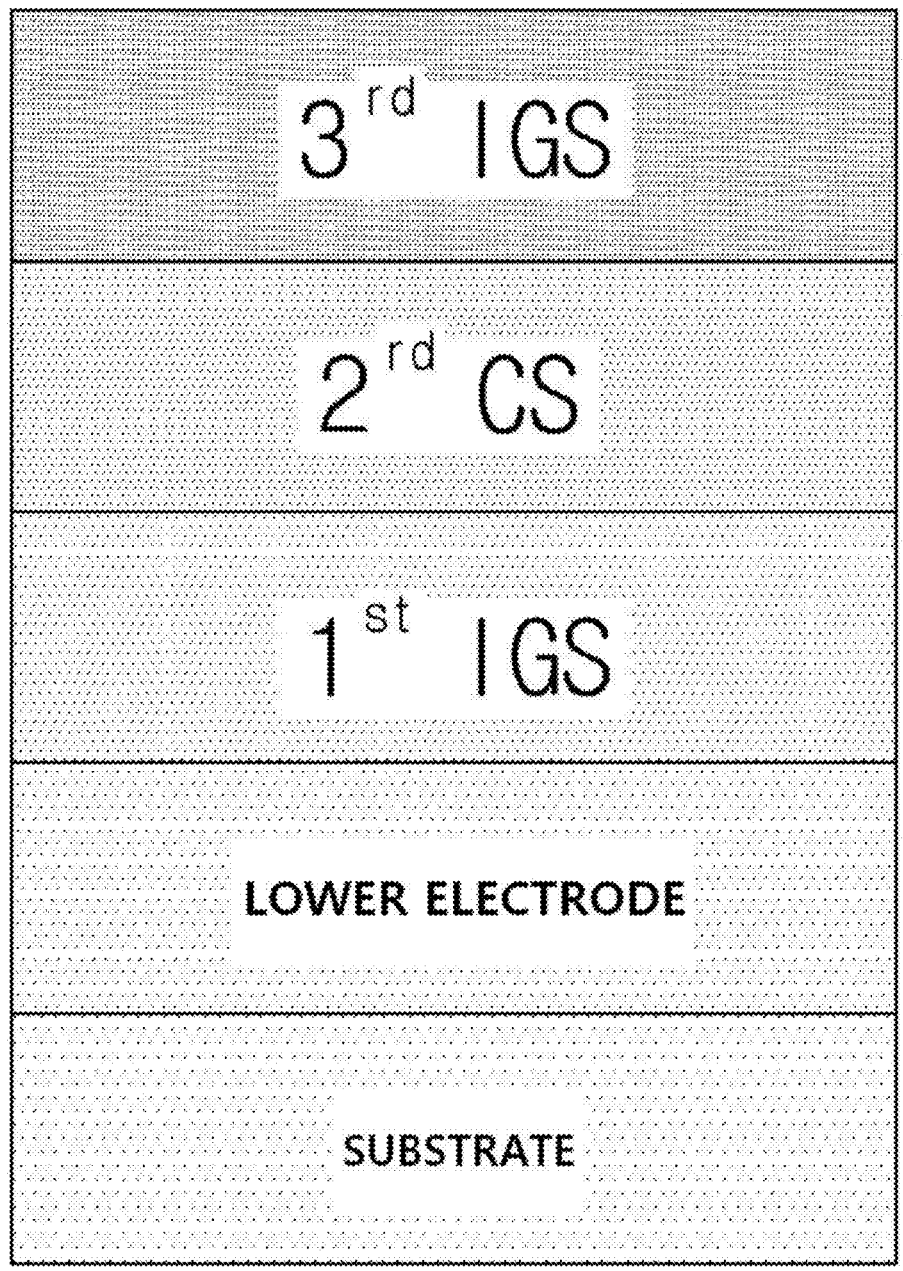
FIGS. 1 and 2 are cross-sectional views illustrating a solar cell according to a first exemplary embodiment of the present invention.

Hereinafter, a method of fabricating a solar cell according to an exemplary embodiment of the present invention will be described in detail. The drawings to be provided below are provided by way of example so that the idea of the present invention can be sufficiently transferred to those skilled in the art to which the present invention pertains. Technical terms and scientific terms used in the present specification have the general meaning understood by those skilled in the art to which the present invention pertains unless otherwise defined, and a description for the known function and configuration obscuring the present invention will be omitted in the following description and the accompanying drawings.

According to an exemplary embodiment of the present invention, in a solar cell including a substrate, a lower electrode layer, a light absorption layer, a buffer layer, and an upper electrode layer, a first precursor layer is deposited on a lower electrode layer by performing sputtering using a target consisting of a compound of IIIb group elements and Se, a second electrode layer is deposited on the first precursor layer by performing the sputtering using a target consisting of a compound of Ib group elements and Se, and a third precursor layer is deposited on the second precursor layer by performing the sputtering using a target consisting of the IIIb element and the Se compound to form a reserved light absorption layer configured of the first precursor layer, the second precursor layer, and the third precursor layer and then a Se atmosphere heat treatment process is performed thereon to form the light absorption layer.

According to the exemplary embodiment of the present invention, the IIIb group element is at least one element selected from aluminum (al), gallium (Ga), and indium (In) and the Ib group element is at least one element selected from copper (Cu) and silver (Ag), in which selenide of these metal elements is used as a sputtering target.

According to the exemplary embodiment of the present invention, the light absorption layer is configured of an IGS layer, a CS layer, and an IGS layer, in which each layer is formed by a sputtering method using the selenide of metal and thus previously forms a stable phase in a depositing process. In the case of performing the sputtering using a metal target according to the related art, two targets of a Cu—Ga mixture and In due to a low melting point (about 30° C.) of Ga are used. In this case, a volume of a sequentially deposited Cu—Ga—In is expanded by selenization heat treatment and Se having a large atom volume is diffused up to a lower portion of thin film and thus a heat treatment process time may be increased. However, according to the exemplar embodiment of the present invention, since metal selenide is sputtered and a composition of the deposited thin film is deposited to be approximately the same as that of the target, heat treatment for re-crystallization may be easy.

Further, according to the exemplary embodiment of the present invention, as compared with co-evaporation, a thin film having very excellent surface roughness may be obtained, due to an ion bombarding effect by plasma.

According to the exemplary embodiment of the present invention, the process of forming the first precursor layer, the second precursor layer, and the third precursor layer may be performed within a temperature range between 20° C. and 500° C.

According to the exemplary embodiment of the present invention, the deposition processes of the first precursor layer, the second precursor layer, and the third precursor may be performed within the same temperature range or different temperature ranges.

According to an aspect, when the precursor deposition is performed within the same temperature range, the deposition process may be performed within a substrate temperature ranging from 150° C. to 450° C. According to another aspect, after the first precursor, when the second precursor layer is deposited at lower temperature, a natural cooling method may be used by radiation under vacuum atmosphere to lower temperature. Further, after the second precursor layer, when the third precursor layer is deposited at higher temperature, a rapid heat treatment method may be used or an isothermal oven may be used. In this case, a beating rate may be controlled to a range between 1° C./S and 10° C./s.

According to the exemplary embodiment of the present invention, in a process of forming a light absorption layer, a chalcogenization heat treatment process is performed to perform selenization or sulfurization. In this case, the chalcogenization heat treatment is performed at 400° C. to 600° C. for 5 to 60 minutes under the atmosphere of any one or more selected from selenium (Se) and sulfur to perform crystallization.

In the process of forming the light absorption layer, after the chalcogenization heat treatment process is performed, the heat treatment using hydrogen sulfide ($H_2S$) may be additionally performed to control a band gap. In the case of performing the $H_2S$ processing, Se is substituted into S on a CIGS surface. In this case, the band gap of the CIGS is increased, in particular, a valence band offset, not a conduction band, is increased and thus the band gap is increased in a state in which a band-alignment with a buffer layer is maintained, thereby increasing an open circuit voltage Voc.

After the heat treatment process, each precursor layer is changed to a CIGS single layer structure in a three layer structure of IGS-CS-IGS and has a form of a final absorption layer.

According to the exemplary embodiment of the present invention, the first precursor layer may have a Ga/(Ga+In) composition ratio of 0.2 to 0.6. When the composition ratio is less than 0.2, the open circuit voltage is reduced and when the composition ratio exceeds 0.6, a short circuit current is reduced, such that solar cell efficiency may be reduced.

Further, the first precursor layer may be configured of a single layer or a plural layer of at least two layers and when a gallium (Ga) content is reduced in a thickness direction from the substrate toward a buffer layer, a charge may be easily transferred.

According to the exemplary embodiment of the present invention, the third precursor layer may have the Ga/(Ga+In) composition ratio of 0.2 to 0.6 to prevent conversion efficiency from reducing. When the composition ratio is less than 0.2, the open circuit voltage is reduced and when the composition ratio exceeds 0.6, a short circuit current is reduced, such that solar cell efficiency may be reduced.

Further, the third precursor layer may be configured of a single layer or a plural layer of at least two layers and the gallium (Ga) content may be increased in the thickness direction from the substrate toward the buffer layer. When the charge is transferred at the time of being bonded with the buffer layer, a harrier is formed and thus recombination probability of electron-hole is reduced in a defect present in a bonded boundary, such that the drop of the open circuit voltage may be prevented, thereby obtain higher efficiency.

According to the exemplary embodiment of the present invention, the ratio of the gallium (Ga) content of the first precursor layer to the gallium (Ga) content of the third precursor layer may be 1:1 to 3:1, more preferably, 1:1 to 2:1 to uniformly maintain the entire Ga concentration.

According to the exemplary embodiment of the present invention, a ratio of the thickness of the first precursor layer to the thickness of the third precursor layer may be controlled within a range of 1:1 to 5:1, When the thickness of the first precursor layer is larger, a surface charge depletion layer is very deeply formed in the CIGS and as the efficiency is reduced due to the reduction in charge density, at least first precursor layer may be formed to be the same or thicker.

Figure 2:
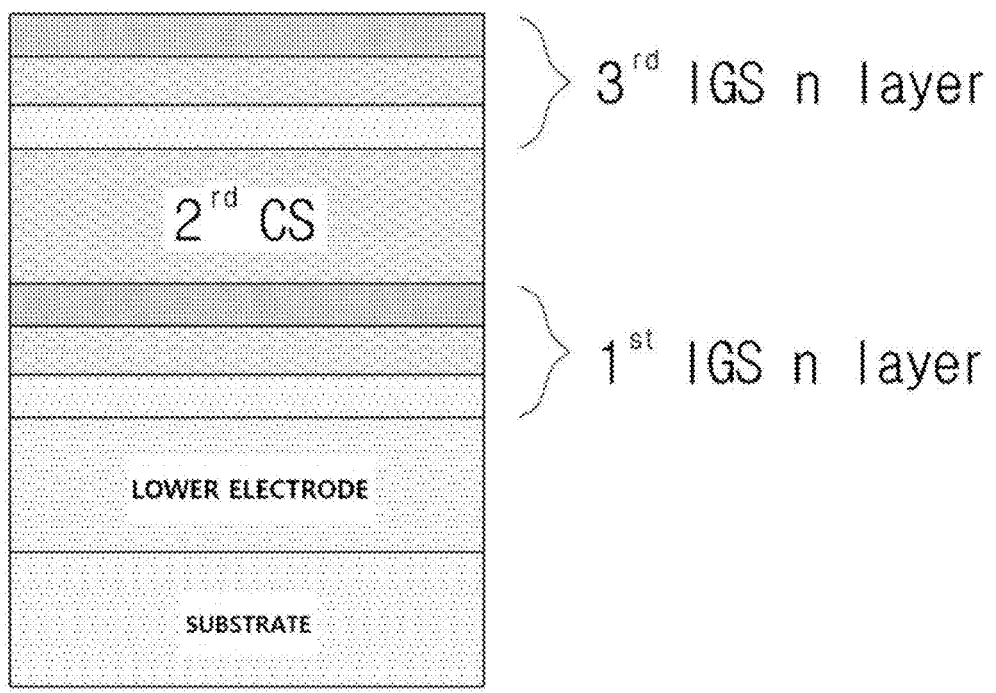

FIG. 1 illustrates a cross-sectional view of a solar cell in which an IGS layer, a CS layer, and an IGS layer are each stacked on a lower electrode by performing the sputtering predetermined metal selenide as a sputtering target and FIG. 2 illustrates that the IGS layer is formed in a multi layer of at least two layers or more, in which a thin film deposited by using the sputtering target at the time of depositing a multi component-based thin film may precisely control the composition ratio and photoelectric efficiency may be maximized by controlling the gallium content.

Figure 3:
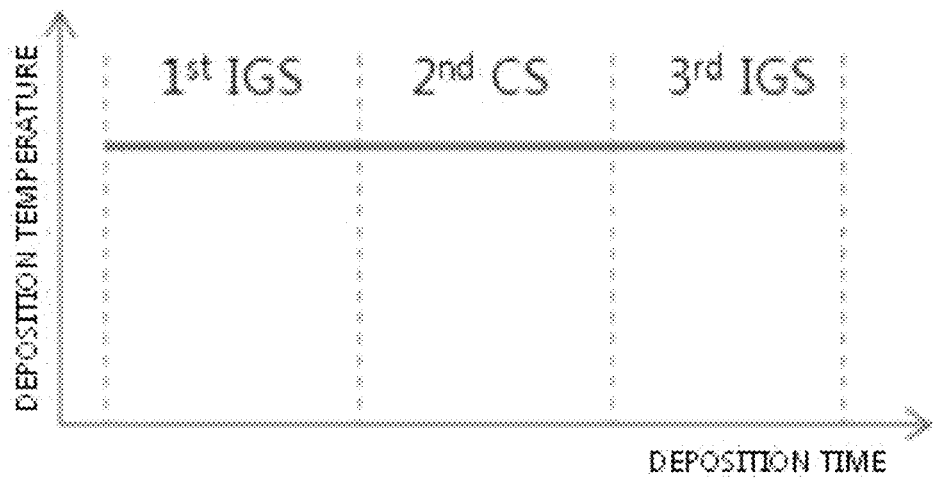
FIGS. 3 to 5 are diagrams illustrating a deposition temperature profile of each precursor layer according to an exemplary embodiment of the present invention.
Figure 4:
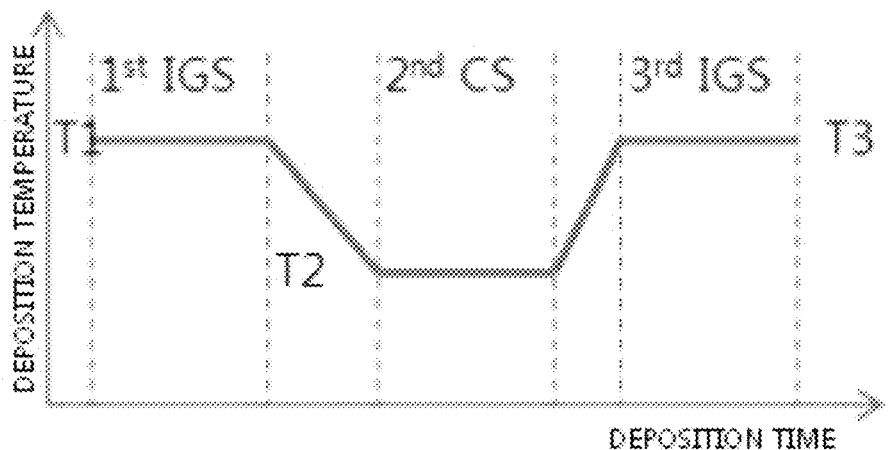
Figure 5:
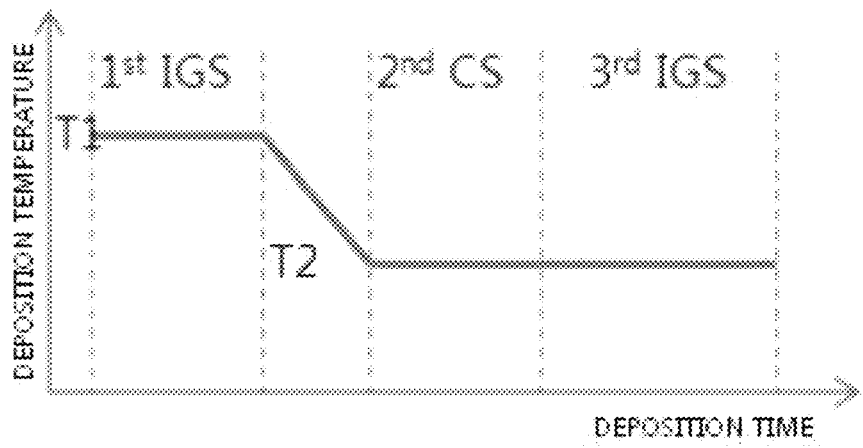

FIGS. 3 to 5 illustrate a temperature profile at the time of deposition using the sputtering method, FIG. 3 illustrates that all the layers are subjected to a process at one temperature condition without changing a temperature condition, FIG. 4 illustrates that the first precursor layer (first IGS layer) is formed at $T_1$ (temperature at the time of depositing the first precursor) and then the second precursor layer (second CS layer) is formed at temperature $T_2$ (temperature at the time of depositing the second precursor) lower than $T_1$ and the third precursor layer (third IGS layer) is formed at temperature $T_3$ (temperature at the time of depositing the third precursor) higher than $T_2$, and FIG. 5 illustrates that the first IGS layer is formed at $T_1$ and the second CS layer and the third IGS layer are formed at temperature $T_2$ lower than $T_1$.

In FIG. 4 or 5, when temperature is reduced to form the second precursor layer, the reaction with the first precursor layer may be reduced at the time of deposition. It is known that a minimum temperature at which the CIGS phase is formed by the reaction of the IGS and the CS is about 250° C. and when the temperature is reduced than the temperature of 250° C. at the time of forming the second precursor layer, the reaction of the first precursor layer and the second precursor layer is minimized and then the re-crystallization may be easy by the high temperature heat treatment.

Figure 6:
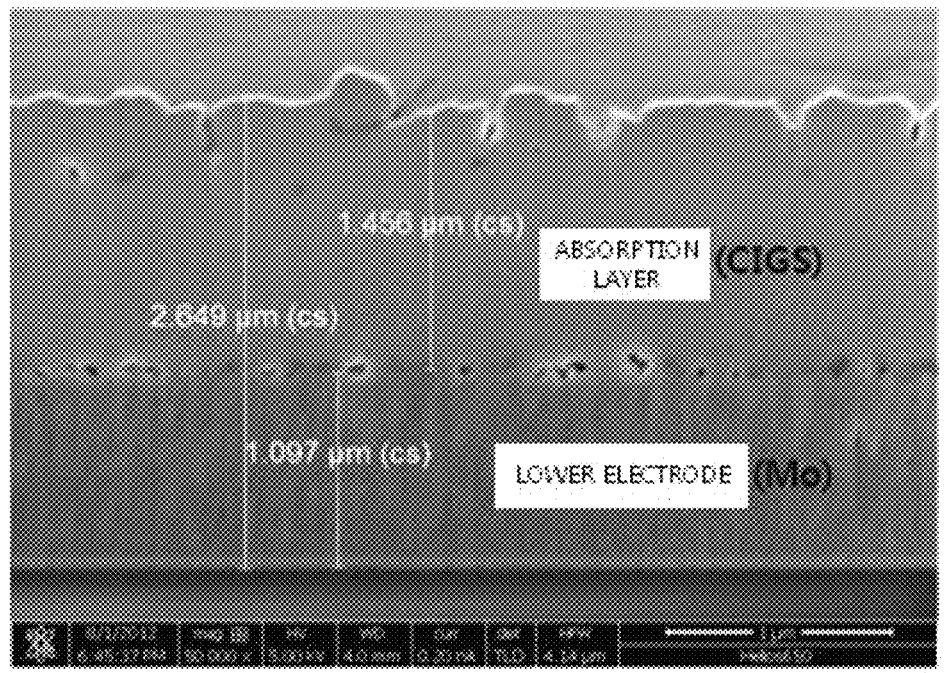
FIG. 6 is a cross-sectional view of a solar cell according to an exemplary embodiment of the present invention.

FIG. 6 is a cross-sectional view of a solar cell according to an exemplary embodiment of the present invention, in which the IGS layer—CS layer—IGS layer are formed depending on the temperature profile and then the heat treatment is performed at 550° C. and the crystallization is performed, such that it may be confirmed that a void is partially present or a film which is small in size and uniform is formed. The first precursor layer is deposited at 350° C., the second precursor layer is deposited at 150° C., and the third precursor layer is deposited at 350° C.

Figure 7:
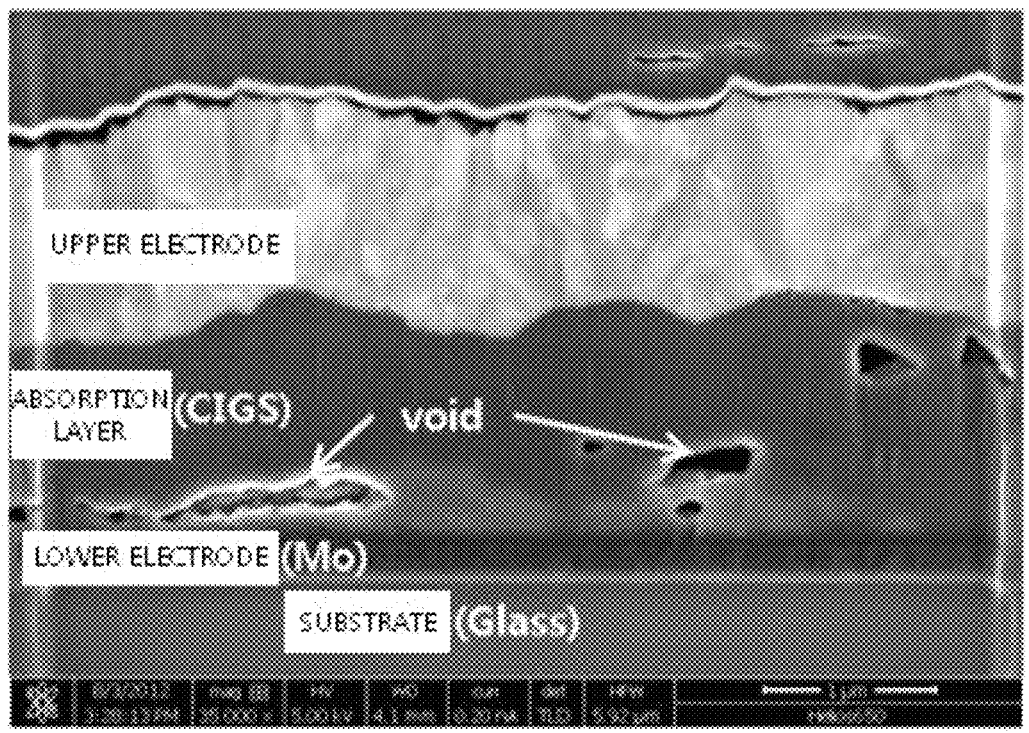
FIG. 7 is a cross-sectional view of a solar cell according to a comparative example.

On the other hand, FIG. 7 is a cross-sectional view of a solar cell by an existing metal sputtering method, in which it may be confirmed that the inside of the CIGS formed by performing the sputtering according to the existing method using the Cu—Ga and In target and then by the selenization and sulfurization processing at high temperature is provided with a plurality of large voids.

Figure 8:
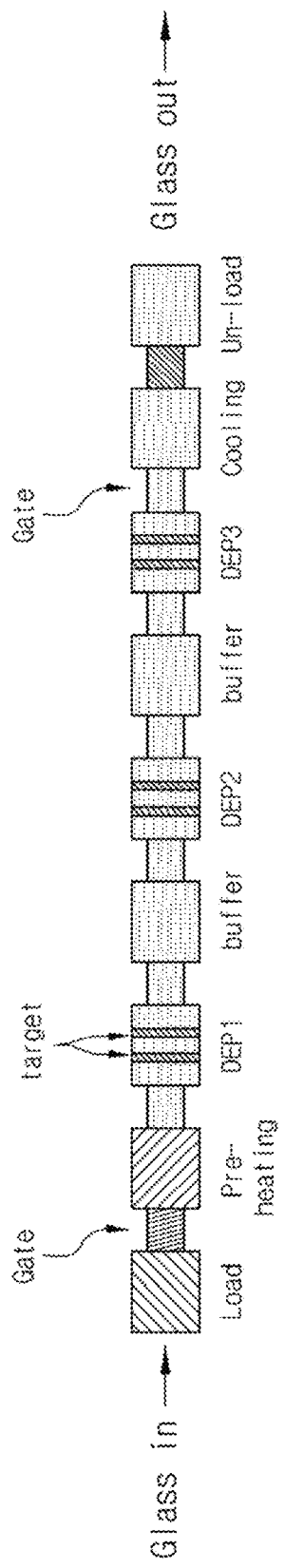
FIG. 8 is a diagram illustrating a process of fabricating a solar ceil according to an exemplary embodiment of the present invention.

FIG. 8 schematically illustrates an apparatus of fabricating a CIGS absorption layer using a metal selenide compound target according to an exemplary embodiment of the present invention. For example, the apparatus of fabricating a CIGS absorption layer may be configured to include a loading chamber into which a substrate is loaded and is subjected to a process under vacuum, a pre-heat chamber for increasing temperature up to a desired temperature prior to deposition, a deposition (DEP) 1 chamber for IGS deposition, a buffer chamber for a change in temperature or a standby state prior to transferring DEP2, a DEP2 chamber for CS deposition, a buffer chamber for a change in temperature or a standby state prior to transferring a DEP3 chamber, a DEP3 chamber for depositing the IGS layer again, a cooling chamber for reducing temperature to a normal, temperature, and an un-load chamber for faking out the completely deposited substrate at a normal pressure. Each deposition chamber (DEP1, DEP2, and DEP3 chambers) may be provided with the plurality of targets to control the composition and the deposition rate and the buffer chamber is not applied when the change in process temperature is not present and the DEP1 to DEP3 chambers may be immediately continuously configured.

Hereinabove, although the present invention has been described by specific matters, exemplary embodiments, and drawings, they have been provided only for assisting in the entire understanding of the present invention. Therefore, the present invention is not limited to the exemplary embodiments. Various modifications and changes may be made by those skilled in the art to which the present invention pertains from this description.

Therefore, the spirit of the present invention should not be limited to the above-described exemplary embodiments, and the following claims as well as ail modified equally or equivalently to the claims are intended to fall within the scope and spirit of the invention.

The invention claimed is:

1. A method of fabricating a solar cell, comprising:
forming a lower electrode layer on a substrate;
forming a first precursor layer on the lower electrode layer by performing a first sputtering using a target consisting of a compound of IIIb group elements and Se;
forming a second precursor layer on the first precursor layer by performing a second sputtering using a target consisting of a compound of Ib group elements and Se;
forming a third precursor layer on the second precursor layer by performing a third sputtering using the target consisting of a compound of IIIb group elements and Se;
forming the light absorption layer by forming the third precursor layer and then performing a Se atmosphere heat treatment process;
forming a buffer layer on the light absorption layer; and
forming an upper electrode layer on the buffer layer,
wherein the first precursor layer is formed at temperature $T_1$, the second precursor layer is formed at temperature $T_2$, the third precursor layer is formed at temperature $T_3$ which is higher than $T_2$ and 500° C. or less, the $T_1$ is higher than $T_2$ and 500° C. or less, and the $T_2$ is 20° C. or more and lower than 250° C.

2. The method of claim 1, further comprising:
after the performing of the Se atmosphere heat treatment process, performing heat treatment using $H_2S$.

3. The method of claim 1, wherein the first precursor layer has a Ga/(Ga+In) composition ratio of 0.2 to 0.6.

4. The method of claim 1, wherein the first precursor layer is a single layer or a plurality of layers of two layers or more and has a reduced gallium (Ga) content toward a thickness direction of the second precursor layer.

5. The method of claim 1, wherein the third precursor layer has a Ga/(Ga+In) composition ratio of 0.2 to 0.6.

6. The method of claim 1, wherein the third precursor layer is a single layer or a plurality of layers of two layers or more and has an increased gallium (Ga) content toward a thickness direction of the buffer layer.

7. The method of claim 1, wherein a ratio of the gallium (Ga) content of the first precursor layer to the gallium (Ga) content of the third precursor layer is 1:1 to 3:1.

8. The method of claim 1, wherein a ratio of a thickness of the first precursor layer to a thickness of the third precursor layer is 1:1 to 5:1.

* * * * *